United States Patent
Dawson et al.

(10) Patent No.: US 9,446,940 B2
(45) Date of Patent: Sep. 20, 2016

(54) STRESS ISOLATION FOR MEMS DEVICE

(71) Applicant: FREESCALE SEMICONDUCTOR, INC., Austin, TX (US)

(72) Inventors: Chad S. Dawson, Queen Creek, AZ (US); Stephen R. Hooper, Mesa, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 14/506,037

(22) Filed: Oct. 3, 2014

(65) Prior Publication Data
US 2016/0096724 A1 Apr. 7, 2016

(51) Int. Cl.
*H04R 23/00* (2006.01)
*B81B 7/00* (2006.01)
*B81C 1/00* (2006.01)

(52) U.S. Cl.
CPC ......... *B81B 7/0048* (2013.01); *B81C 1/00325* (2013.01); *B81B 7/007* (2013.01); *B81B 2203/0118* (2013.01); *B81C 1/00301* (2013.01)

(58) Field of Classification Search
USPC .......................... 257/418, 415, 417, 253, 254
See application file for complete search history.

(56) References Cited

U.S. PATENT DOCUMENTS

| | | | |
|---|---|---|---|
| 5,488,862 A | 2/1996 | Neukermans et al. | |
| 5,770,883 A | 6/1998 | Mizuno et al. | |
| 5,850,042 A | 12/1998 | Warren | |
| 5,914,801 A | 6/1999 | Dhuler et al. | |
| 6,215,137 B1 | 4/2001 | Suzuki et al. | |
| 6,433,401 B1 | 8/2002 | Clark et al. | |
| 7,019,231 B2 | 3/2006 | Ishikawa et al. | |
| 7,280,014 B2 | 10/2007 | Potter | |
| 8,049,287 B2 | 11/2011 | Combi et al. | |
| 8,304,275 B2 | 11/2012 | Schlarmann et al. | |
| 8,648,432 B2 * | 2/2014 | Haeusler ............. | B81C 1/00246 257/418 |
| 2005/0172717 A1 | 8/2005 | Wu et al. | |
| 2008/0016683 A1 | 1/2008 | Brida et al. | |
| 2008/0290430 A1 | 11/2008 | Mahadevan et al. | |
| 2010/0019393 A1 | 1/2010 | Hsieh et al. | |
| 2010/0315938 A1 | 12/2010 | Ascanio et al. | |
| 2013/0214365 A1 | 8/2013 | Schlarmann et al. | |
| 2014/0252512 A1 | 9/2014 | Yang et al. | |
| 2015/0115387 A1 | 4/2015 | Buckley et al. | |
| 2016/0051131 A1 | 2/2016 | Jeong et al. | |

OTHER PUBLICATIONS

OA from U.S. Appl. No. 14/564,340 dated Feb. 19, 2016.
Office Action U.S. Appl. No. 14/658,598, 17 pages dated Jun. 24, 2016.
Office Action U.S. Appl. No. 14/564,340, 19 pages dates Jun. 16, 2016.

* cited by examiner

*Primary Examiner* — Timor Karimy
(74) *Attorney, Agent, or Firm* — Charlene R. Jacobsen

(57) ABSTRACT

A microelectromechanical systems (MEMS) die includes a substrate having a recess formed therein and a cantilevered platform structure. The cantilevered platform structure has a platform and an arm extending from the platform, wherein the platform and arm are suspended over the recess. The arm is fixed to the substrate and is a sole attachment point of the platform to the substrate. A MEMS device resides on the platform. Fabrication methodology entails forming the recess in the substrate, with the recess extending inwardly from a surface of the substrate, and attaching a structural layer over the recess and over the surface of the substrate. The MEMS device is formed on the structural layer and the structural layer is removed around a perimeter of the platform and the arm to form the cantilevered platform structure.

10 Claims, 4 Drawing Sheets

US 9,446,940 B2

STRESS ISOLATION FOR MEMS DEVICE

TECHNICAL FIELD OF THE INVENTION

The present invention relates generally to microelectromechanical systems (MEMS) devices. More specifically, the present invention relates to a MEMS die with improved stress isolation.

BACKGROUND OF THE INVENTION

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in a variety of products such as automobile airbag systems, control applications in automobiles, navigation, display systems, inkjet cartridges, and so forth.

There are significant challenges to be surmounted in the packaging of MEMS devices due at least in part to the necessity for the MEMS devices to interact with the outside environment, the fragility of many types of MEMS devices, and severe cost constraints. Indeed, many MEMS device applications require smaller size and low cost packaging to meet aggressive cost targets. The packaging of MEMS sensor applications often uses materials with dissimilar coefficients of thermal expansion. As such, a high thermally induced stress can develop during MEMS device manufacture or operation. These thermal stresses, as well as stresses due to moisture and assembly processes, can result in deformation of the underlying substrate, referred to herein as package stress. Variations in package stress can cause instability of the MEMS device and output shifts in the MEMS device.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

As the uses for microelectromechanical systems (MEMS) devices continue to grow and diversify, increasing emphasis is being placed on smaller size and low cost packaging without sacrificing part performance. Embodiments entail a MEMS die and a method of a MEMS die for improved stress isolation. In particular, a MEMS device is created through the execution of relatively simple methodology on a cantilevered platform structure which is connected to a bulk substrate at a sole attachment point. Such a configuration enables isolation of the MEMS device from outside stresses, such as packaging and/or thermal stresses.

Figure 1:
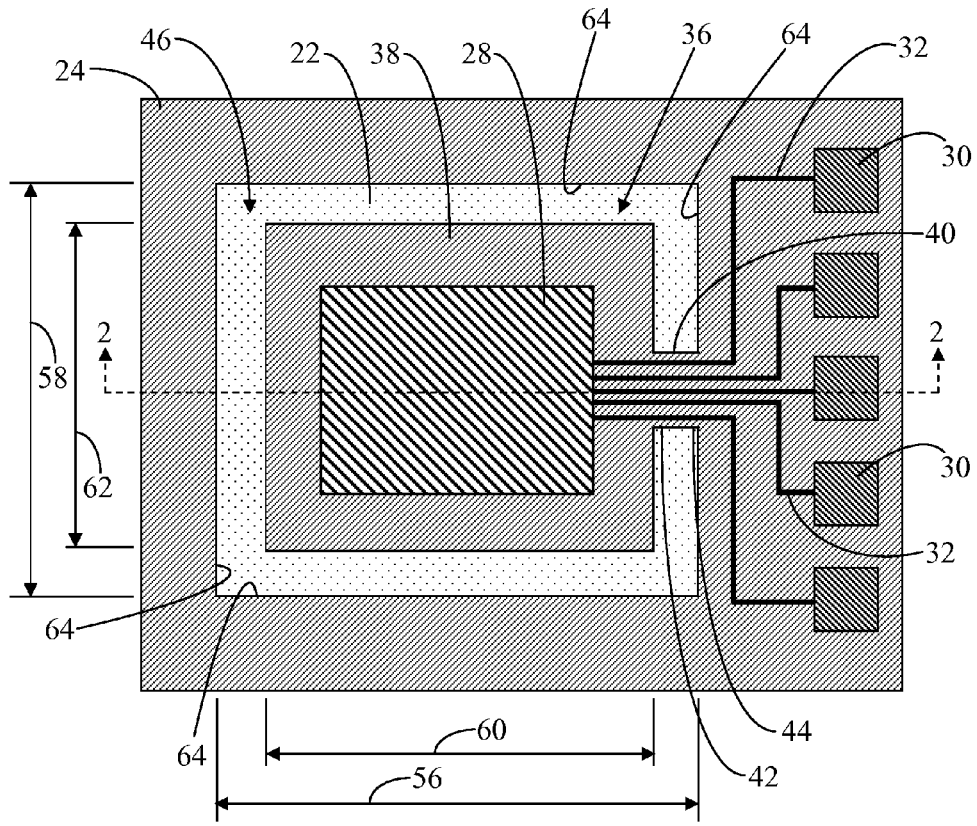
FIG. 1 shows a top view of a microelectromechanical systems (MEMS) die in accordance with an embodiment.
Figure 2:
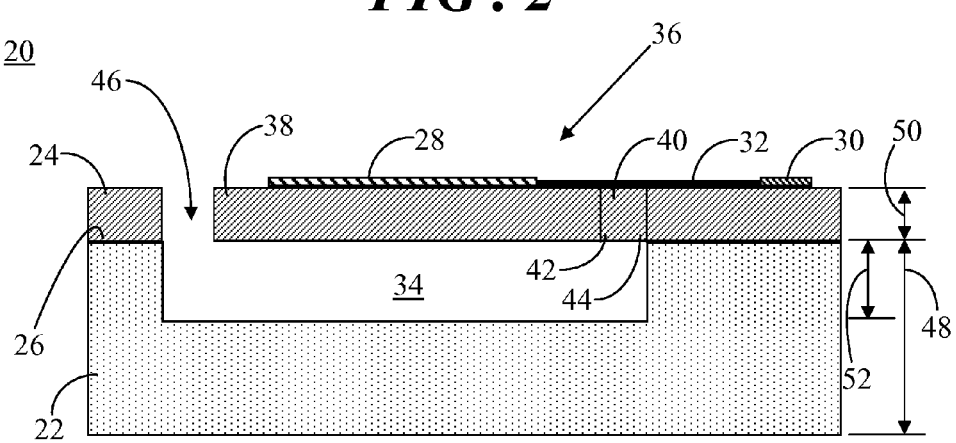
FIG. 2 shows a side sectional view of the MEMS die at section lines 2-2 of FIG. 1.

Referring now to FIGS. 1 and 2, FIG. 1 shows a top view of a microelectromechanical systems (MEMS) die 20 in accordance with an embodiment, and FIG. 2 shows a side sectional view of MEMS die 20. The side sectional view of MEMS die 20 shown in FIG. 2 is taken along section lines 2-2 of FIG. 1. FIGS. 1-2 and subsequent FIGS. 4-8 are illustrated using various shading and/or hatching to distinguish the different elements of MEMS die 20, as will be discussed below. These different elements within the structural layers may be produced utilizing current and upcoming micromachining techniques of depositing, patterning, etching, and so forth.

MEMS die 20 generally includes a bulk substrate 22, a structural layer 24 fixed to a surface 26 of bulk substrate 22, and a MEMS device 28 formed on, or alternatively in, structural layer 24. MEMS die 20 further includes bond pads 30 on structural layer 24 and conductive traces 32 interconnected between MEMS device 28 and bond pads 30. Conductive traces 32 suitably electrically couple MEMS device 28 with bond pads 30. Bond pads 30 may be utilized to electrically connect MEMS device 28 to external components, such as an integrated circuit die, not shown herein for simplicity. MEMS die 20 may include additional components such as a cap layer, overmolding, and the like, also not shown herein for simplicity.

In accordance with an embodiment, bulk substrate 22 has a recess 34 extending inwardly from surface 26, and structural layer 24 is fixed to surface 26 of bulk substrate 22 surrounding recess 34. A material portion of structural layer 24 is removed surrounding MEMS device 28 to form a cantilevered platform structure 36 at which MEMS device 28 resides. Thus, cantilevered platform structure 36 is formed in structural layer 24 and resides over recess 34.

Cantilevered platform structure 36 includes a platform 38 and an arm 40 extending from platform 38. A first end 42 of arm 40 is fixed to platform 38, and a second end 44 of arm 40 is fixed to bulk substrate 22. More particularly, second end 44 of arm 40 is fixed to bulk substrate 22 via an attachment of arm 40 to a portion of structural layer 24 fixed to surface 26 of bulk substrate 22. Thus, once the material portion of structural layer 24 is removed, an opening 46 extends through structural layer 24 and partially surrounds cantilevered platform structure 36. Accordingly, platform 38 and arm 40 are suspended over recess 34, with second end 44 of arm 40 being the sole attachment point of cantilevered platform structure 36 to the surrounding bulk substrate 22. The terms "first" and "second" used herein do not refer to an ordering or prioritization of elements within a countable series of elements. Rather, the terms "first" and "second" are used to distinguish the particular elements for clarity of discussion.

In the illustrated embodiment, bulk substrate 22 exhibits a thickness 48, and structural layer 24 exhibits a thickness 50 that is less than thickness 48 of bulk substrate 22. Additionally, recess 34 is defined by a depth 52 that is less than thickness 48 of bulk substrate 22. That is, recess 34 extends only partially through substrate 22. Additionally, recess 34 exhibits a first area defined by a length 56 and a width 58 of a rectangular shape of recess 34. The first area, defined by length 56 and width 58, is substantially parallel to a second area defined by a length 60 and a width 62 of the rectangular shape of platform 38. Length 56 and width 58 of recess 34 are greater than the corresponding length 60 and width 62 of platform 38 so that platform 38 does not contact edges 64 of bulk substrate 22 that surround recess 34. This difference in areas defines the width of opening 46 between platform 38 and edges 64 of bulk substrate 22.

The illustrated configuration yields MEMS device 22 formed on a cantilevered platform structure 36 that is suspended over recess 34. Moreover, cantilevered platform structure 36 merely extends through the thickness of structural layer 24, instead of extending through the bulk, i.e., the entirety, of substrate 22. This cantilevered platform structure can achieve the benefits of improved package stress isolation, improved device performance, and a simplified package which reduces package costs.

Figure 3:
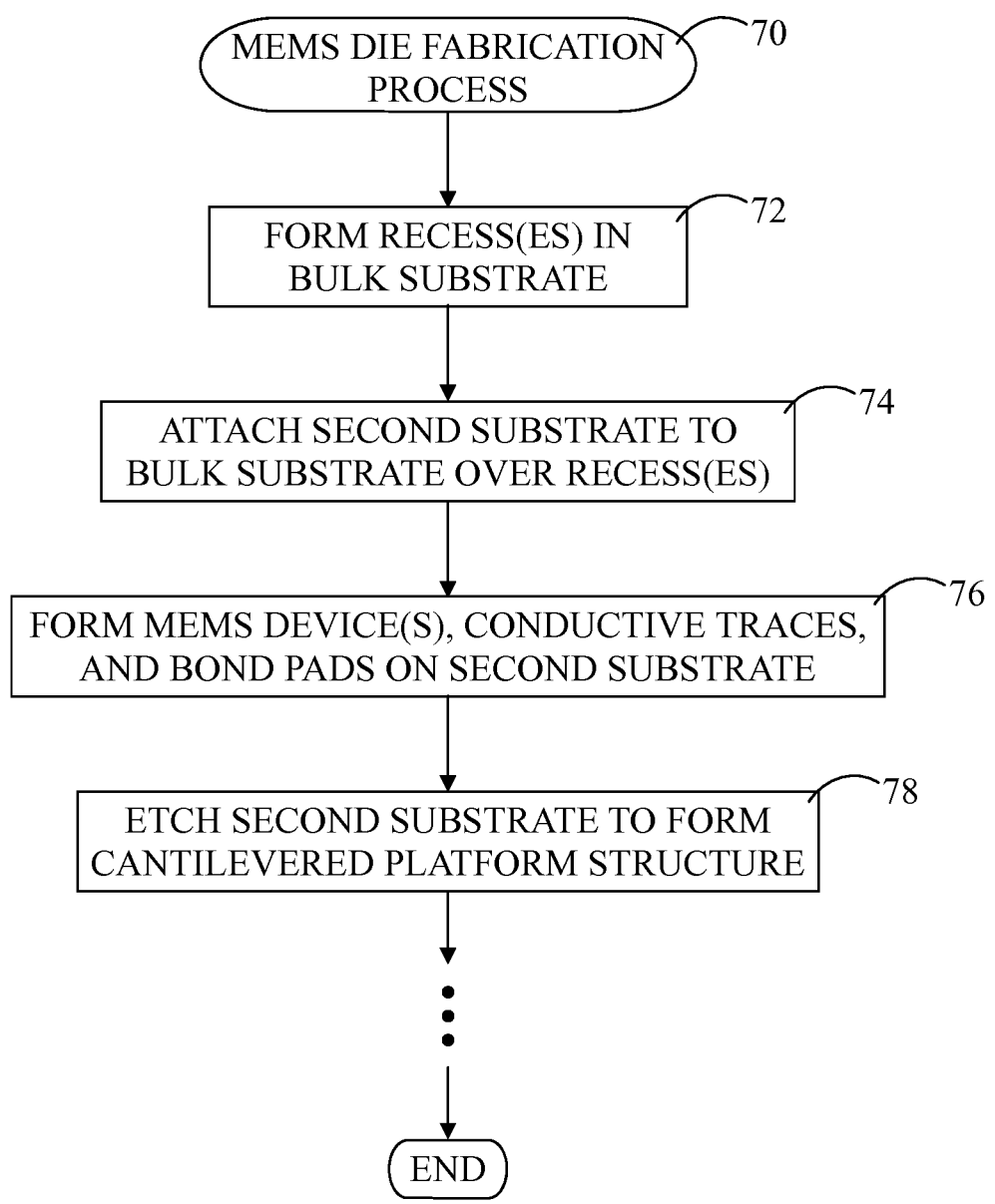
FIG. 3 shows a flowchart of a MEMS die fabrication process for producing the MEMS die of FIGS. 1 and 2 in accordance with another embodiment.

Now referring to FIG. 3, FIG. 3 shows a flowchart of a MEMS die fabrication process 70 for producing MEMS die 20 (FIG. 1) in accordance with another embodiment. More specifically, the flowchart of FIG. 3 illustrates a particular method for producing MEMS die 20 having cantilevered platform structure 36. Although a particular, exemplary method of fabricating MEMS die 20 is described in conjunction with FIG. 2, it is to be understood that other fabrication methodologies may be alternatively be used to produce MEMS die 20. As such, the exemplary fabrication method of FIG. 2 is not to be construed as limiting, but is instead provided as an example of a possible fabrication method that may be implemented.

The methodology of FIG. 3 is described in connection with the fabrication of a single MEMS die 20 for simplicity of illustration. However, it should be apparent to those skilled in the art that the ensuing methodology may be executed to concurrently fabricate a plurality of MEMS dies 20 in a wafer level fabrication process.

In a block 72 of MEMS die fabrication process 70, recess 34 is formed in bulk substrate 22. In a block 74, a second substrate (e.g., structural layer 24) is attached to surface 26 of bulk substrate 22 over recess 34. In a block 76, MEMS device 28, conductive traces 32, and bond pads 30 are formed on the second substrate. In a block 78, a portion of the second substrate is etched, sawn, or otherwise removed to form cantilevered platform structure 36. Ellipses following block 78 represent additional operations that may ensue during the execution of MEMS die fabrication process 70. These additional operations may include, for example, wafer level testing, singulation of a wafer structure of the first and second substrates having a plurality of cantilevered platform structures and MEMS devices formed thereon, attachment of a lid, wirebonding with an application specific integrated circuit, overmolding, and so forth. These additional operations are not described herein for brevity.

Figure 4:
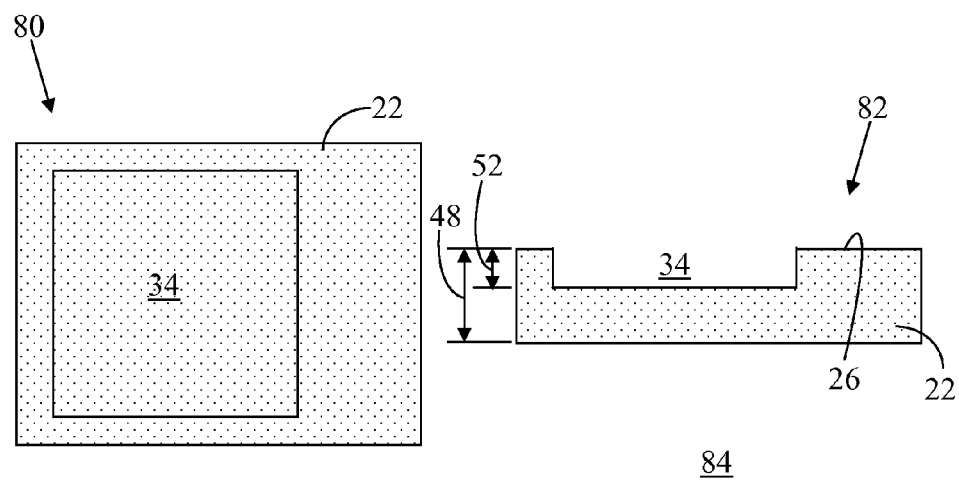
FIG. 4 shows a top view and a side sectional view of a bulk substrate at an initial stage of processing.

FIG. 4 shows a top view 80 and a side sectional view 82 of bulk substrate 22 at an initial stage 84 of processing. In accordance with block 72 of MEMS die fabrication process 70 (FIG. 3), one or more portions of bulk substrate 22 are sawn, etched, or otherwise removed to form a corresponding one or more of recesses 34 (one shown). In particular, recess 34 is etched from surface 26 into substrate 22 to depth 52 that is less than thickness 48 of substrate 22.

Figure 5:
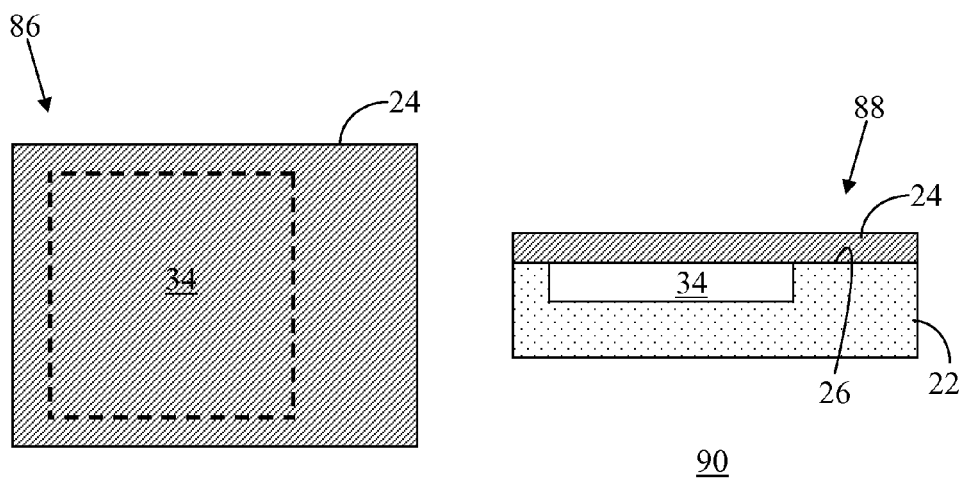
FIG. 5 shows a top view and a side sectional view of the structure of FIG. 4 at a subsequent stage of processing.

FIG. 5 shows a top view 86 and a side sectional view 88 of the structure of FIG. 4 at a subsequent stage 90 of processing. In accordance with block 74 of MEMS die fabrication process 70 (FIG. 3), structural layer 24 is attached to surface 26 of bulk substrate 22 so that recess 34 is interposed between structural layer 24 and bulk substrate 22. In an embodiment, structural layer 24 may be a substrate, in the form of a single crystal wafer, that is attached to bulk substrate 22 using a silicon on insulator (SOI) process, fusion bonding, or another similar process. Following attachment of structural layer 24 to bulk substrate 22, a buried cavity, i.e., recess 34, is formed. In top view 86, the perimeter of recess 34 is represented by dashed lines.

Figure 6:
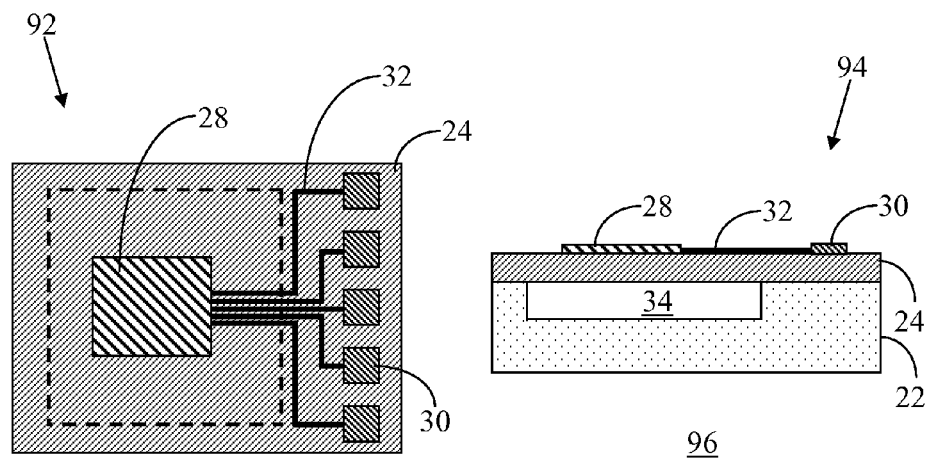
FIG. 6 shows a top view and a side sectional view of the structure of FIG. 5 at a subsequent stage of processing.

FIG. 6 shows a top view 92 and a side sectional view 94 of the structure of FIG. 5 at a subsequent stage 96 of processing. In accordance with block 76 of MEMS die fabrication process 70 (FIG. 3), MEMS device 28, conductive traces 32, and bond pads 30 are formed on, or alternatively in, structural layer 24. In some embodiments, MEMS device 28 may be built on structural layer 24 using, for example, a surface micromachining process to form a capacitive sensor. Conductive traces 32 may be fabricated in connection with the fabrication of MEMS device 28. Next, metal deposition, patterning, and etching may be performed to form bond pads 30. Conductive traces 32 interconnect MEMS device 28 with bond pads 30 to form suitable electrical connections. Other fabrication activities may be performed per convention that are not discussed or illustrated herein for clarity of description.

Figure 7:
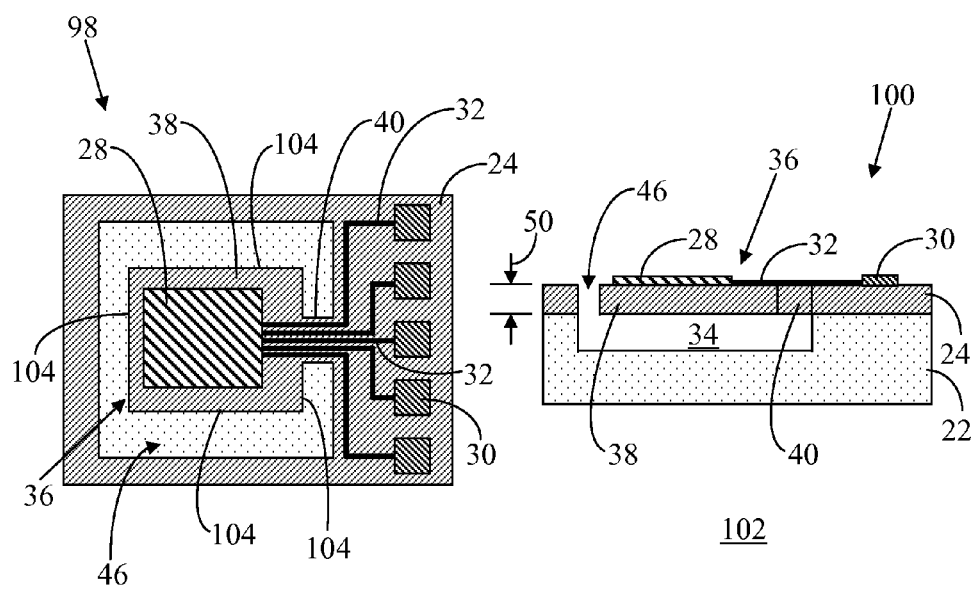
FIG. 7 shows a top view and a side sectional view of the structure of FIG. 6 at a subsequent stage of processing.

FIG. 7 shows a top view 98 and a side sectional view 100 of the structure of FIG. 6 at a subsequent stage 102 of processing. In accordance with block 78 of MEMS die fabrication process 70 (FIG. 3), a portion of the second substrate is etched, sawn, or otherwise removed to form cantilevered platform structure 36. By way of example, a mask (not shown) may be used to cover or otherwise protect those regions of the structure that are not to be etched. As such, the mask provides a pattern for forming openings 46 through structural layer 24 and for producing cantilevered platform structure 36. The removal process may be performed using any of a number of known and upcoming etching processes, such as a Deep Reactive Ion Etch (DRIE) technique, a Potassium Hydroxide (KOH) etch technique, or any suitable techniques, so that thickness 50 of structural layer 24 is removed around a perimeter 104 demarcating platform 38 and arm 40 in order to form cantilevered platform structure 36. FIG. 7 represents the outcome of the etching process so that opening 46 and, consequently, cantilevered platform structure 36, are formed. Note that conductive traces 32 are suitably routed so that they reside on arm 40 in order to interconnect MEMS device 28 located on platform 38 with bond pads 30.

An embodiment of a MEMS die includes a substrate having a recess formed therein and a cantilevered platform structure having a platform and an arm extending from the platform. The platform and the arm are suspended over the recess, the arm is fixed to the substrate, and a MEMS device resides on the platform.

An embodiment of a method of making a MEMS die includes forming a recess in a substrate, the recess extending from a first surface of the recess, and fixing a cantilevered platform structure to the substrate. The cantilevered platform structure has a platform and an arm extending from the platform, wherein the fixing attaches the arm to the substrate and suspends the platform and the arm over the recess. The method further includes forming a MEMS device on the platform.

Thus, a MEMS die is created through the execution of relatively simple methodology on a cantilevered platform structure which is connected to a bulk substrate at a sole attachment point. Such a cantilevered platform structure enables isolation of a MEMS device residing on the cantilevered platform structure from outside stresses, such as packaging and/or thermal stresses. Accordingly, the cantilevered platform structure can achieve the benefits of improved package stress isolation for the MEMS device, improved device performance, and a simplified package which reduces package costs.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A microelectromechanical systems (MEMS) die comprising:
    a substrate having a recess formed therein;
    a cantilevered platform structure having a platform and an arm extending from said platform, wherein said platform and said arm are suspended over said recess, and said arm is fixed to said substrate; and
    a MEMS device residing on said platform;
    a structural layer fixed to a surface of said substrate surrounding said recess, wherein said cantilevered platform structure extends from said structural layer to reside over said recess;
    bond pads on said structural layer; and
    conductive traces on said arm, said conductive traces electrically coupling said MEMS device with said bond pads.

2. The MEMS die of claim 1 wherein said recess is defined by a depth that is less than a thickness of said substrate.

3. The MEMS die of claim 1 wherein said recess exhibits a first area substantially parallel to a second area of said platform, said first area being greater than said second area so that said platform does not contact edges of said substrate surrounding said recess.

4. The MEMS die of claim 1 wherein said arm is a sole attachment point of said platform to said substrate.

5. The MEMS die of claim 1 wherein said arm is attached to said structural layer.

6. The MEMS die of claim 1 wherein said arm is a sole attachment point of said platform to said structural layer.

7. The MEMS die of claim 1 wherein said substrate exhibits a first thickness, and said structural layer exhibits a second thickness, said second thickness being less than said first thickness.

8. A microelectromechanical systems (MEMS) die comprising:
    a substrate having a recess formed therein, said recess having a depth that is less than a thickness of said substrate;
    a cantilevered platform structure having a platform and an arm extending from said platform, wherein said platform and said arm are suspended over said recess, said arm is fixed to said substrate, and said arm is a sole attachment point of said platform to said substrate; and
    a MEMS device residing on said platform;
    a structural layer fixed to a surface of said substrate surrounding said recess, wherein said cantilevered platform structure extends from said structural layer to reside over said recess;
    bond pads on said structural layer; and
    conductive traces on said arm, said conductive traces electrically coupling said MEMS device with said bond pads.

9. The MEMS die of claim 8 wherein said recess exhibits a first area substantially parallel to a second area of said platform, said first area being greater than said second area so that said platform does not contact edges of said substrate surrounding said recess.

10. The MEMS die of claim 8 wherein said arm is attached to said structural layer to form said sole attachment point of said platform to said structural layer.

* * * * *